(12) United States Patent
Holt et al.

(10) Patent No.: US 7,024,328 B2
(45) Date of Patent: Apr. 4, 2006

(54) SYSTEMS AND METHODS FOR NON-INTRUSIVE TESTING OF SIGNALS BETWEEN CIRCUITS

(75) Inventors: Keith W. Holt, Wichita, KS (US);
Jeremy D. Stover, Wichita, KS (US);
Andrew A Cottrell, Wichita, KS (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/766,085

(22) Filed: Jan. 27, 2004

(65) Prior Publication Data
US 2005/0165572 A1    Jul. 28, 2005

(51) Int. Cl.
*G01R 31/00*    (2006.01)

(52) U.S. Cl. .................. 702/117; 702/124; 702/118; 714/724

(58) Field of Classification Search ................ 702/117, 702/58, 59, 108, 118, 124, 126, 189; 375/224, 375/228, 225, 226; 370/241, 241.1, 242, 370/244, 248, 247, 251, 252; 324/500, 512, 324/537, 555, 73.1; 714/5, 6, 25, 27, 30, 714/42, 712, 718, 724, 733, 739, 742, 763, 714/770, 799, 820, 821; 711/114; 365/201; 379/1.01, 1.04, 9.06, 12
See application file for complete search history.

(56) References Cited

U.S. PATENT DOCUMENTS

2002/0133740 A1* 9/2002 Oldfield et al. ................. 714/6
2002/0170006 A1* 11/2002 Schaber et al. ............. 714/724

FOREIGN PATENT DOCUMENTS

EP    1271334 A2 *  1/2003

* cited by examiner

*Primary Examiner*—Hal Wachsman
(74) *Attorney, Agent, or Firm*—Duft Bornsen & Fishman, LLP

(57) ABSTRACT

Structures and methods for non-intrusive testing of communication signals exchanged between two circuit boards via an intermediate interconnect board. In one aspect hereof, the functional signal normally exchanged between the circuits is latched during the exchange of test signals and the latched functional signal is utilized within the circuit that normally receives the functional signal to continue normal operations. In another aspect hereof, the test signals are exchanged over a dedicated test signal path between the two circuits. In another aspect hereof, the test signals are exchanged over the functional signal paths as out of band signals.

20 Claims, 5 Drawing Sheets

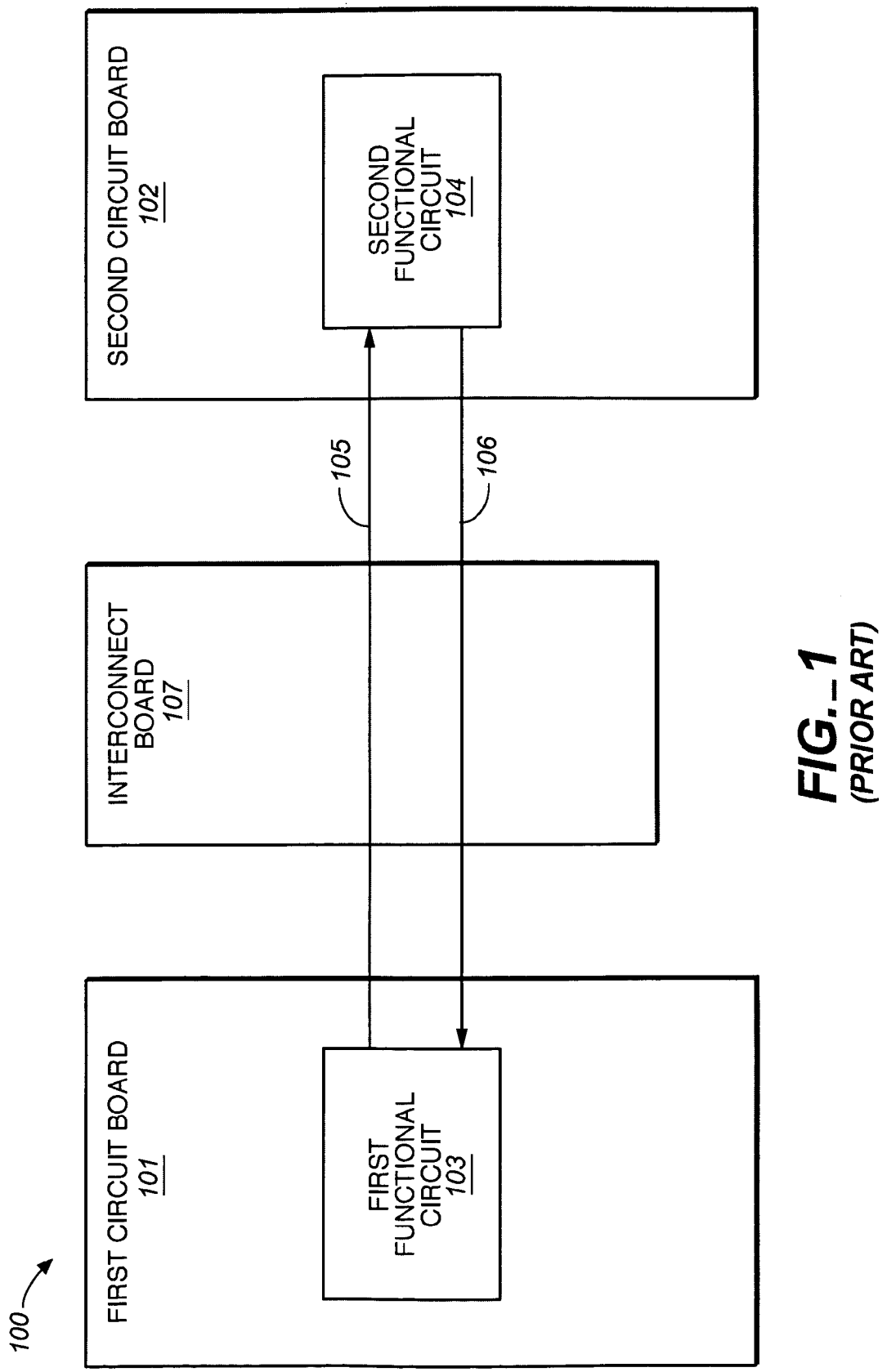
FIG._1
*(PRIOR ART)*

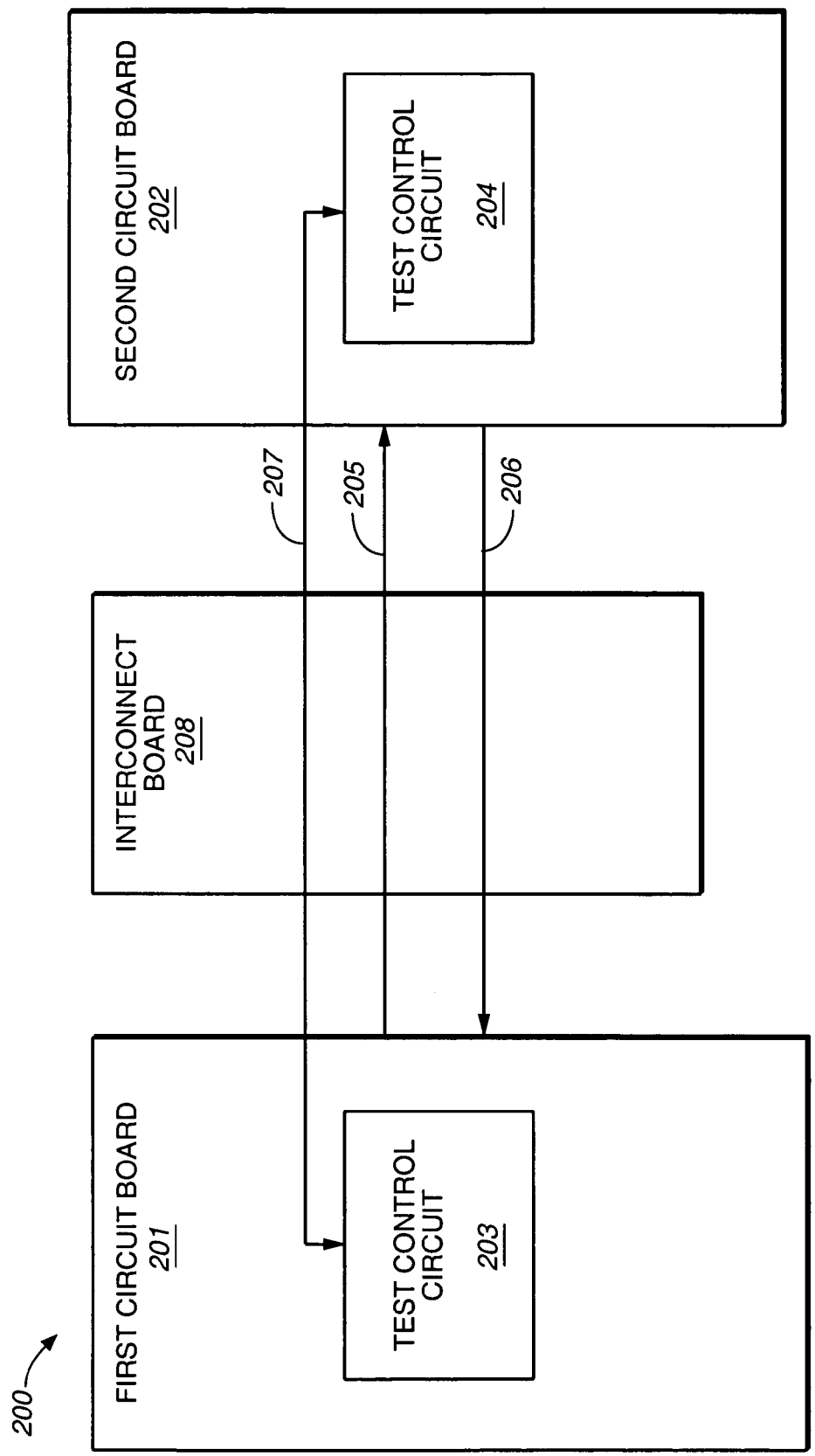
FIG._2

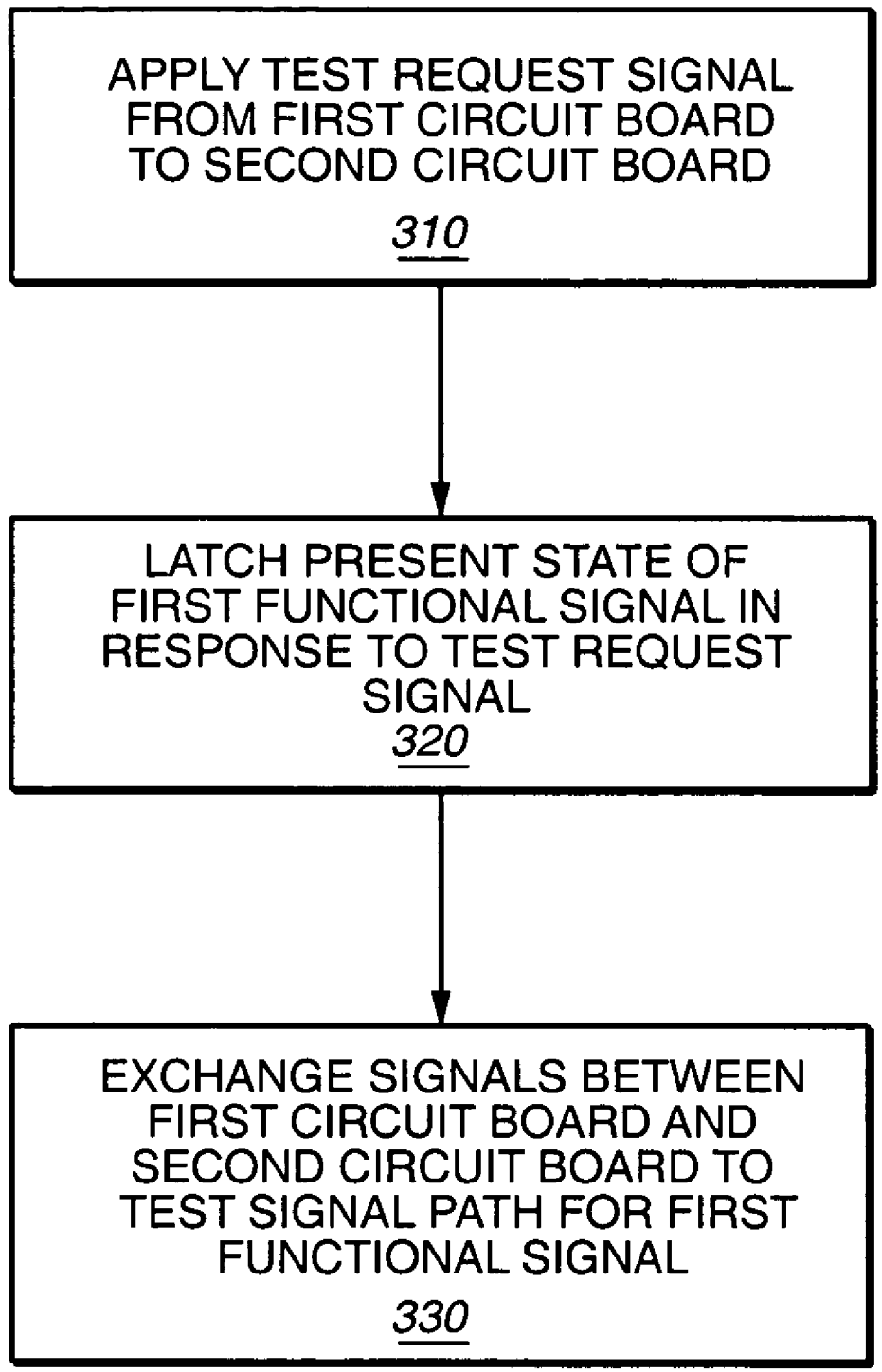
FIG._3

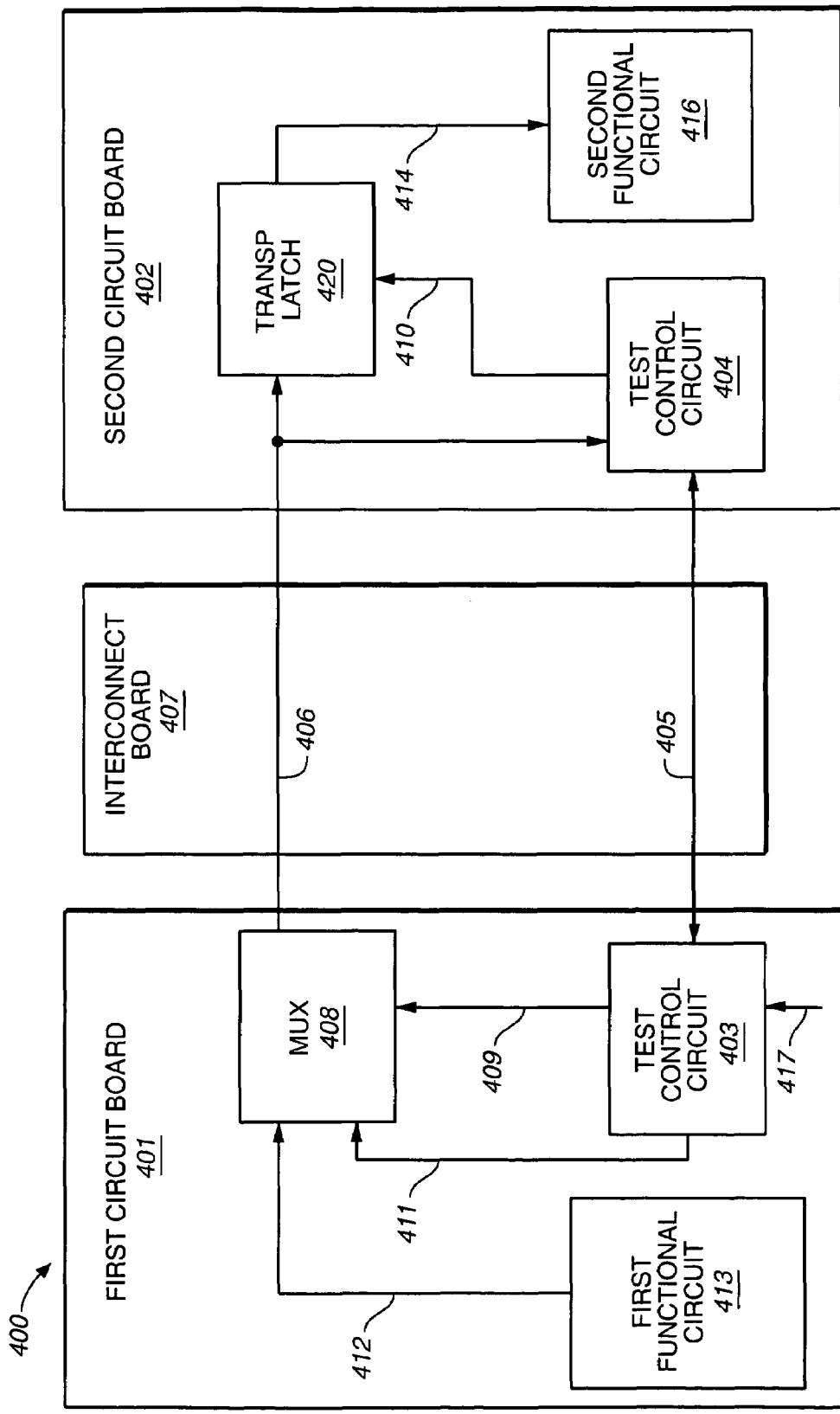
FIG._4

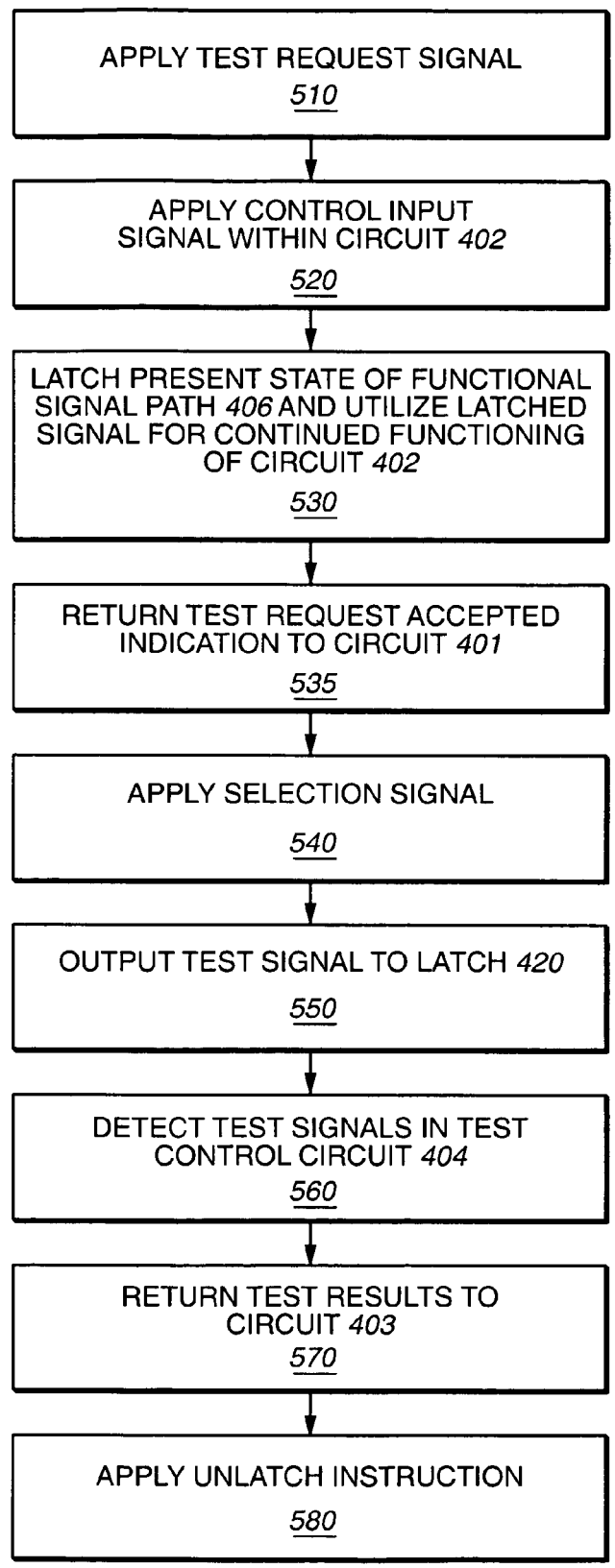
*FIG._5*

SYSTEMS AND METHODS FOR NON-INTRUSIVE TESTING OF SIGNALS BETWEEN CIRCUITS

BACKGROUND OF THE INVENTION

1. Field of the Invention

The invention is related to circuits, and in particular to systems and methods for non-intrusive testing communication signals between circuits.

2. Description of Related Art

Electronic devices often communicate with one another to cooperatively perform an intended function. Different functional components are sometimes implemented on distinct circuit boards that communicate with one another to provide the desired function. The distinct boards communicate over one or more defined signal paths. Often, an interconnect board connects multiple circuit boards to couple the signal paths, thereby facilitating communication between multiple circuits implemented on separate boards. For example, a bus back-plane may be used to interconnect defined signals between two or more circuit boards coupled to the backplane interconnect board. Discrete control lines and discrete status lines implemented on the interconnect board interconnect the multiple circuits. Discrete control and status lines may serve as reset signals, watchdog, and in-place signals, among other purposes. In-place signals may allow processing elements on each board to determine whether other systems contain alternate processing elements. Reset signals may allow each circuit board to reset the alternate circuit board to a known state if other communication paths fail. Watchdog signals may be used between circuits to allow one circuit to monitor the operation of the other circuit.

FIG. 1 illustrates an exemplary interconnected system 100 as presently known in the art. Interconnected system 100 includes first circuit board 101, second circuit board 102, and interconnect board 107. Interconnect board 107 is sometimes referred to as a mid-plane or as a back-plane. First functional circuit 103 is implemented on first circuit board 101 to perform intended functionality. Second functional circuit 104 is implemented on second circuit board 102 to perform intended functionality. First functional circuit 103 is coupled to second functional circuit by first path 105 and second path 106. Circuit 103 may generate a signal to be applied to second circuit 104 via path 105. Second circuit 104 may generate a signal to be applied to first circuit 103 via path 106. For example, each circuit may generate a reset signal to be applied to the other circuit in accordance with desired functionality. Often such signals are in pairs such as shown in FIG. 1. Each signal path is used identically in one of the two circuits. Often such mirrored pairs of signal paths are referred to as "cross-coupled" signal paths or cross-coupled signals.

Circuits require testing of such interconnect signals to maintain and ensure proper operation of the interconnect signals paths. For example, where each circuit monitors operation of the other (such as by use of a watchdog periodic signal transmission) and may reset a failed circuit (such as by use of a reset signal), these signal paths should be periodically tested to confirm their proper operation.

For first circuit board 101 to test second circuit board 102 requires active circuit components implemented on interconnect board 107. However, many system designs discourage the use of active circuit components on interconnect boards to test other circuits because active circuit components make diagnosing mechanical circuit problems with discrete lines more difficult (i.e., testing to detect broken signal traces or bent connector pins). Further, active circuits on such interconnect boards may interfere with specified signal timing requirements by imposing additional delays or other types of signal interference or distortion. Other solutions have included active circuits on the communicating circuit boards that coordinate with the functional logic of the communicating circuit boards to effectuate testing of signals exchanged therebetween. Such integration of testing features with functional circuit designs adds complexity in that existing functional circuit designs (i.e., standard components or standard cells) may require modifications.

It is evident from the above discussion that a need exists for improved designs to permit non-intrusive testing of interconnected circuit signal paths (i.e., cross-coupled signal paths).

SUMMARY OF THE INVENTION

The present invention solves the above and other problems, thereby advancing the state of the useful arts, by providing structures and methods for non-intrusive testing of communication signals exchanged between two circuit boards via an intermediate interconnect board. In one aspect hereof, test signals are exchanged between the two circuit boards without requiring active circuits on the interconnect board. In another aspect hereof, the functional signal normally exchanged between the circuits is latched during the exchange of test signals and the latched functional signal is utilized within the circuit that normally receives the functional signal to continue normal operations. In another aspect hereof, the test signals are exchanged over a dedicated test signal path between the two circuits. In another aspect hereof, the test signals are exchanged over the functional signal paths as out of band signals. Another aspect hereof provides testing of the functional signals without requiring modification of functional logic incorporated in the communicating circuit boards.

One feature hereof therefore provides a system for testing communication between a first circuit board and a second circuit board, the system comprising: a first functional signal path coupled between the first circuit board and the second circuit board for transmitting a first functional signal from the first circuit board to the second circuit board; a test signal path coupled between the first circuit board and the second circuit board for exchanging test signals between the first circuit board to the second circuit board; a first test control circuit in the first circuit board coupled to the test signal path and adapted to apply a test request signal to the test signal path; and a second test control circuit in the second circuit board coupled to the first functional signal path and coupled to the test signal path and adapted to latch the present state of the signal on the first functional signal path for use within the second circuit board in response to receipt of the test request signal from the first circuit board.

Another feature hereof provides a system for testing a cross-coupled signal pair coupled between a first circuit board and a second circuit board, the system comprising: a first functional signal path of the cross-coupled signal pair for applying a first functional signal from the first circuit board to the second circuit board; a second functional signal path of the cross-coupled signal pair for applying a second functional signal from the second circuit board to the first circuit board; test signal means for exchanging test signals between the first and second circuit boards associated with testing the first functional signal path and associated with testing the second functional signal path; first test control logic in the first circuit board coupled to the test signal means and coupled to the second functional signal path for latching the present state of the second functional signal within the first circuit board during testing of the second functional signal path; and second test control logic in the second circuit board coupled to the test signal means and coupled to the first functional signal path for latching the present state of the first functional signal within the second circuit board during testing of the first functional signal path. The first test control logic is operable to latch the present state of the second functional signal in response to a test request signal received from the second test control logic through the test signal means. The second test control logic is operable to latch the present state of the first functional signal in response to a test request signal received from the first test control logic through the test signal means.

Another feature hereof provides a method for testing a cross-coupled signal pair coupled between a first and second circuit board, the method comprising the steps of: applying a first test request signal from the first circuit board to the second circuit board such that the first test request signal is out of band with respect to the cross-coupled signal pair; latching within the second circuit board the present state of a first functional signal of the cross-coupled signal pair in response to detection of the first test request signal; exchanging test signals between the first circuit board and the second circuit board to test the signal path for the first functional signal; and using the latched present state of the first functional signal within the second circuit board during the exchange of test signals.

BRIEF DESCRIPTION OF THE DRAWINGS

FIG. 1 illustrates an interconnected system as presently known in the art.

FIG. 2 illustrates an exemplary system with enhanced test capability in accordance with features and aspects hereof.

FIG. 3 illustrates exemplary operation of an exemplary test system in accordance with features and aspects hereof.

FIG. 4 illustrates an exemplary system with enhanced test capability in accordance with features and aspects hereof.

FIG. 5 illustrates exemplary operation of an exemplary test system in accordance with features and aspects hereof.

DETAILED DESCRIPTION OF THE DRAWINGS

FIGS. 2 through 5 and the following description depict specific embodiments of features and aspects hereof to teach those skilled in the art how to make and use the best mode of the invention. For the purpose of teaching inventive principles, some conventional aspects have been simplified or omitted. Those skilled in the art will appreciate variations from these embodiments that fall within the scope of the invention. Those skilled in the art will also appreciate that the features described below can be combined in various ways to form multiple embodiments of the invention. As a result, the invention is not limited to the specific embodiments described below, but only by the claims and their equivalents.

FIG. 2 illustrates test system 200. Test system 200 may include first circuit board 201 coupled to second circuit board 202 by functional signal path 205 and functional signal path 206 through interconnect board 208. Circuit 201 may generate a signal applied to circuit 202 via path 205. Circuit 205 may generate a signal applied to circuit 201 via path 206. Paths 205 and 206 may therefore be referred to as across-coupled signal pair. First circuit board 201 may further include test control circuit 203. Second circuit board 202 may further include test control circuit 204. Test signal path 207 couples test control circuit 203 to test control circuit 204. Test control circuit 203 may be configured to apply a test request signal to test signal path 207. Test control circuit 204 is configured to detect the test request signal from test signal path 207. Such a test request indicates that test control circuit 203, on behalf of circuit 201, wishes to test the functional signal path 205 (or path 206) used to exchange signals between circuit 201 and circuit 202. Functional signal path 205 may be configured to transfer a first functional signal from first circuit board 201 to second circuit board 202. Signal path 206 may be configured to transfer a second functional signal from circuit 202 to circuit 201.

Test signal path 207 provides a signaling path between circuits 201 and 202 that does not interfere with intended functionality of circuits 201 and 202. As discussed further herein below, the test control circuits 203 and 204 may be configured to latch or otherwise save the present state of functional signal paths 205 and 206 in response to the exchange of signals on test signal path 207. The latched or saved state may be used within the circuit 201 or 202 while testing is conducted of the functional signal paths 205 or 206. Thus the intended functionality of circuits 201 and 202 is not interfered with by the testing and the interconnect board 208 need not include any active circuits that may further interfere to operation of the circuits 201 and 202. Cross-coupled signals 205 and 206 may therefore be tested in a non-intrusive manner and within requirements of the relevant specification as regards absence of active circuits on the interconnect board.

FIG. 3 illustrates exemplary operation of test system 200 of FIG. 2. Test control circuit 203 applies a test request signal to test signal path 207 (Step 310). The test request signal indicates to second circuit board 202 that first circuit board 201 desires to test functional signal paths (i.e., 205 and/or 206) coupled to second circuit board 202. In response to detecting the test request signal, test control circuit 204 in second circuit board 203 latches the present state of the first functional signal carried by functional signal path 205 (Step 320). Lastly, first circuit board 201 and second circuit board 202 exchange signals to test the signal path for the first functional signal (step 330).

Advantageously, test system 200 operating according to the method of FIG. 3 allows first circuit board 201 to test second circuit board 202 without interrupting the regular operations of second circuit board 202. Such an advantage is desirable within dual control systems. For example, test system 200 could be applied within a redundant storage controller system. Additionally, test system 200 could be applied to an active/passive control system wherein a passive control circuit periodically tests an active control circuit to ensure that the active control circuit is functioning correctly. In the event that the active control circuit is not functioning correctly, the passive control chip can assume the operations of the active control chip. Test system 200 could also be applied in the context of redundant storage controllers in a RAID (Redundant Array of Inexpensive Disks) storage subsystem. For example, consider a system where circuits 201 and 202 are redundant RAID storage controllers. Such redundant controllers may each generate a reset signal to be applied to the other controller if/when a failure is sensed in the other controller. First circuit 201 may generate such a signal to be applied to second circuit via path 205. Second circuit 202 may generate such a signal to apply to first circuit 201 via path 206. First circuit 201 may test the reset functional signal path 205 after sending a test request signal via path 207. Circuit 202 will latch the present state of the reset functional signal on path 205 so that any testing of the signal path does not interfere with the normal operations of the system.

Those skilled in the art will recognize that the system of FIG. 2 depicts a symmetric structure in which either first circuit 201 or second circuit 202 may test an associated functional signal (i.e., either 205 or 206) directed to the other controller. Similarly, the method of FIG. 3 may operate in a symmetric manner in that either circuit may request that the other controller prepare for testing of an associated functional signal path by latching or otherwise storing the present state of the functional signal. Further, it will be recognized that the structure of FIG. 2 or the method of FIG. 3 may be adapted such that only one circuit may initiate the test request directed to the other.

FIGS. 4 and 5 provide another exemplary system and associated method of operation embodying features and aspects hereof. FIG. 4 illustrates test system 400 including first circuit board 401 and second circuit board 402 coupled by signal path 406 through interconnect board 407. System 400 provides additional details of an embodiment hereof but simplifies the system 400 by depicting and discussing testing of interconnect signals only by first circuit 401. Those skilled in the art will readily understand that the structure and operation may be mirrored to provide testing performed by the second circuit 402.

First circuit board 401 includes test control circuit 403 and first functional circuit 413 for generating signals to be applied to functional signal path 406. First functional circuit 413 represents any appropriate circuitry for generating nominal signals applied to path 412 to be applied to path 406 in accordance with the intended function of first circuit 401. Test control circuit 403 may generate test signals applied to path 411 to be applied to path 406 for purposes of testing the signal path 406 as described further herein below. Test request circuit may include control input 417 for receiving instructions from other external circuits (not shown) to indicate a need to initiate testing. Alternatively, test control circuit 403 may initiate testing operations based on its own processing and analysis.

The nominal, functional signals on path 412 and the test signals on path 411 are applied as inputs to multiplexer 408 (MUX 408). MUX 408 selectively applies either the nominal functional signals on path 412 or the test signals on path 411 to path 406. Selection by MUX 408 is in accord with the selection signal applied to the multiplexer on selection signal path 409 by test control circuit 403. When operating normally in accordance with the intended functioning of system 400, test control circuit 403 applies a signal to path 409 to cause MUX 408 to select signals on path 412 for application to path 406. Test control circuit 403 exchanges signals with second circuit 402 via path 405 to coordinate testing and normal operation between first circuit 401 and second circuit 402. When test control circuit 403 properly coordinates with corresponding circuits in second circuit 402 as discussed further herein below, a signal on path 409 causes MUX 408 to select test signals on path 411 to signal path 406 to thereby test proper operation of the signal path.

Second circuit board 402 includes test control circuit 404 and second functional circuit 416 for receiving and processing signals applied to paths 406 and 405 from first circuit 401. Test control circuit 404 receives a test request signal on path 405 from test control circuit 403 in first circuit 401 to signify a need by first circuit 401 to test signal path 406. Signals applied to functional signal path 406 may be applied in parallel to test control circuit 404 and to transparent latch 420. The output signal of transparent latch 420 is applied via path 414 to functional circuit 416 for normal functional processing. As known to those of ordinary skill in the art, transparent latch 420 is adapted to pass the present state of functional signal 406 through to its output signal path 414 until a control signal applied to path 410 causes transparent latch 420 to latch the present state of signal 406.

In response to a received test request, test control circuit 404 applies a test mode signal to path 410 indicating that the second circuit 402 is now operating in a test mode at the request of first circuit 401. The signal on path 410 is applied to transparent latch 420 to actuate transparent latch 420 to latch, preserve or store the present state of any functional signals presently applied to path 406. The latched present state of functional signals presently applied to path 406 may be used as discussed further below to continue normal operation of functional circuit 416 within second circuit 402 during test mode operation thereof.

While the latched signal is applied to the functional circuit 416, test mode operations may alter the signals applied to functional signal path 406 to thereby test the operation and connectivity thereof. Test control circuit 403 in first circuit 401 and test control circuit 404 in second circuit 402 may exchange signals over path 406 and/or path 405 to test operation and connectivity of functional signal path 406. Numerous techniques for testing signal path 406 will be readily apparent to those skilled in the art in a test mode in which the earlier, latched valid state of the functional signal path 406 is saved for application to the functional circuit 416. For example, in test mode operations, signals applied to path 406 may be received by test control circuit 404 in second circuit 402 and directed back to test control circuit 403 via path 405. Alternatively, the present state of the functional signal path 406 may be recorded within a register or other memory element (not shown) within test control circuit 404. A command/response protocol may then be used over path 405 to request a read of the register. Such a read request may be forwarded as a command from test control circuit 403 to test control circuit 404 via path 405. The data requested by such a command may be returned via path 405 from test control circuit 404 to test control circuit 403. The first circuit 401 may thereby test proper operation and connectivity of functional signal path 406 by controlling the signal applied to path 406 during test mode operation and reading back the state sensed by second circuit 402.

As noted above, those skilled in the art will recognize that the simplified structure and operation depicted in FIG. 4 may be easily extended (i.e., mirrored) to permit similar testing of another functional data path (not shown) used to transmit information from second circuit 402 to first circuit 401. Further, those skilled in the art will recognize that test signal path 405 may be a discrete conductive path dedicated to the test mode communications discussed above as well as other equivalent communicative couplings. For example, path 405 may represent out of band signaling over existing communication signal paths. Where, for example, signals applied to functional signal path 406 are modulated or encoded in any manner, test mode signals may be applied by modulating or encoding the test signals in a manner outside the defined communication bands of the nominal functional signaling. Therefore, as used herein and as depicted in FIGS. 2 and 4, a test signal path may be a discrete signaling channel physically distinct from the functional signal paths being tested or may be a form of out of band modulation or encoding applied to the same functional signal paths being tested.

FIG. 5 illustrates exemplary operation of test system 400 shown in FIG. 4. First, test control circuit 403 transmits a test request signal over test signal path 405 to test control circuit 404 (Step 510). As noted above, test control circuit 403 may initiate the test request based on its own logic such as on a periodic timed basis or based on external stimuli. Such external stimuli may be external circuits that determine when such testing is required or even interactive human user input indicating a need to test the communication channels associated with certain signals. In response to the test request signal, test control circuit 404 within second circuit 402 applies a control input signal over control input path 410 to transparent latch 420 (Step 520). The control input signal directs transparent latch 420 to store the present state of the signal presently applied to functional signal path 406 (Step 530). This step permits the second functional circuit 416 of circuit 402 to continue its intended normal functioning regardless of test related signals applied to functional signal path 406 during test mode operation. The functional circuit 416 continues operation using the latched state of the functional signal 406. By contrast, under normal operations, the present state input of functional signal path 406 comprises the nominal signal applied by first functional circuit 413 through MUX 408 and applied to second functional circuit 416 through the unlatched mode of transparent latch 420.

Continuing with FIG. 5, test control circuit 404 returns a signal to test control circuit 403 via path 405 to indicate acceptance of the test request and readiness for testing sequences (Step 535). Since step 530 latched the most recent function signal applied to functional signal path 406 and applied the latched state as input to the functional circuit 416, circuit 403 may now commence desired testing of signal path 406. Test control circuit 403 then applies a selection signal over selection signal input path 409 to MUX 408 (Step 540). The selection signal applied to MUX 408 causes MUX 408 to output either the nominal signal received from first functional circuit 413 on its path 412, or the test signal from test request circuit 403 on its path 411. In this case, the selection signal directs MUX 408 to output the test signal received over test signal input path 411. With the MUX 408 so selected to apply the test signal from test control circuit 403 to path 406, test control circuit 403 then generates desired test signals and applies the test signals to path 406 via path 411 and MUX 408 (Step 550). The test signals applied to path 406 are sensed by test control circuit 404 in second circuit 402. The results of the test signal may be sensed in test control circuit 404 and either returned to test control circuit 403 automatically or saved within test control circuit 404 until the results are requested by test circuit 403 (Step 560). Test control circuit 403 receives the returned test results from test control circuit 404 over test signal path 405 (Step 570). As noted above, the test results may, as a matter of design choice, be returned automatically by operation of suitable protocols between test control circuits 403 and 404 or may be stored in suitable registers or memory elements within the test control circuit 404 until requested and "read" by test control circuit 403. Test control circuit 403 may then transmit an unlatch instruction to test control circuit 404 (Step 580) via path 405. The unlatch instruction signals the test control signal 404 to unlatch the latched signal path out of transparent latch 420 and to thereby restore normal configuration for continued normal operations. Similarly, test control circuit 403 in circuit 401 may deselect MUX 408 to restore the normal connectivity of functional circuit 413 to functional circuit 416 via path 412, MUX 408, path 406, transparent latch 420 and path 414.

With the system 400 configuration so restored for normal operation, intended functionality and corresponding signaling over path 406 may resume.

Test system 400 operable in accordance with the method of FIG. 5 allows first circuit board 401 to test second circuit board 402 without interrupting the regular operations of second circuit board 402. Such an advantage is desirable within dual control systems. For example, test system 400 could be applied within a redundant storage controller. Additionally, test system 400 could be applied to an active/passive control system wherein a passive control circuit periodically tests an active control circuit to ensure that the active control circuit is functioning correctly. In the event that the active control circuit is not functioning correctly, the passive control circuit can assume the operations of the active control circuit. Test system 400 could be applied to an active/passive or dual active controller pair in the context of redundant storage controllers in a RAID storage subsystem.

More broadly, features and aspects hereof provide the ability for one circuit board to test discrete control and status lines without impacting the operation of a second circuit board and without requiring undesirable active circuits on an intermediate, interconnect board (such as a mid-plane or back-plane). As discussed above, this is accomplished by latching the state of the signals in the alternate circuit board prior to performing tests. Further, features and aspects hereof do not require any synchronization between the testing circuit board and the circuit board under test. Testing can be performed independent of the state of the circuit board under test. While the test system provides a mechanism to allow a first circuit board to test signal transitions observed by a second circuit board, the same mechanism could be applied to cross-coupled signals sent from the second circuit board to the first circuit board. In such a case, the first circuit board would test its own ability to observe the signal transitions from the second board by causing the signal transitions in the second circuit board.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. In particular, those of ordinary skill in the art will readily recognize that features and aspects hereof may be implemented equivalently in electronic circuits or as suitably programmed instructions of a general or special purpose processor. Such equivalency of circuit and programming designs is well known to those skilled in the art as a matter of design choice. As a result, the invention is not limited to the specific examples and illustrations discussed above, but only by the following claims and their equivalents.

What is claimed is:

1. A system for testing communication between a first circuit board and a second circuit board, the system comprising:

a functional signal path coupled between the first circuit board and the second circuit board for transmitting a functional signal from the first circuit board to the second circuit board;

a test signal path coupled between the first circuit board and the second circuit board for exchanging test signals between the first circuit board and the second circuit board;

a first test control circuit in the first circuit board coupled to the test signal path and adapted to apply a test request signal to the test signal path; and a second test control circuit in the second circuit board coupled to the functional signal path and coupled to the test signal path and adapted to latch the present state of the functional signal on the functional signal path for use within the second circuit board in response to receipt of the test request signal from the first circuit board.

2. The system of claim 1 wherein the second test control circuit comprises:

a latch coupled to the functional signal path to latch the present state of the functional signal in response to receipt of the test request signal; and control logic coupled to the latch and adapted to selectively apply the latched present state of the functional signal for further use within the second circuit board.

3. The system of claim 2 wherein the latch comprises a transparent latch having an output signal path and having a selection input signal path and adapted to apply a latched output signal or an unlatched output signal to the output signal path and wherein the control logic is adapted to apply a select signal to the selection input signal path of the transparent latch to select the latched output signal of the transparent latch to be applied to the output signal path of the transparent latch for use by the circuits of the second circuit board.

4. The system of claim 3 wherein the second test control circuit further comprises:

test logic to exchange signals with the first circuit board via the test signal path and the functional signal path to test the functional signal path while the transparent latch is selected to apply the latched present state of the functional signal to the output of the transparent latch.

5. The system of claim 1 wherein functional signal comprises a reset signal.

6. The system of claim 1 wherein the first and second circuit boards comprise redundant controllers.

7. The system of claim 1 wherein the first and second circuit boards comprise redundant storage controllers in a RAID storage subsystem.

8. A system for testing a cross-coupled signal pair coupled between a first circuit board and a second circuit board, the system comprising:

a first functional signal path of the cross-coupled signal pair for applying a first functional signal from the first circuit board to the second circuit board;

a second functional signal path of the cross-coupled signal pair for applying a second functional signal from the second circuit board to the first circuit board;

test signal means for exchanging test signals between the first and second circuit boards associated with testing the first functional signal path and associated with testing the second functional signal path;

first test control logic in the first circuit board coupled to the test signal means and coupled to the second functional signal path for latching the present state of the second functional signal within the first circuit board during testing of the second functional signal path; and second test control logic in the second circuit board coupled to the test signal means and coupled to the first functional signal path for latching the present state of the first functional signal within the second circuit board during testing of the first functional signal path, wherein the first test control logic is operable to latch the present state of the second functional signal in response to a test request signal received from the second test control logic through the test signal means, and wherein the second test control logic is operable to latch the present state of the first functional signal in response to a test request signal received from the first test control logic through the test signal means.

9. The system of claim 8 where the first and second functional signals are reset signals.

10. The system of claim 8 where the first and second functional signals are watchdog signals.

11. The system of claim 8 where the first and second circuit boards are a redundant pair of controllers.

12. The system of claim 11 where the controllers are RAID storage controllers.

13. The system of claim 8 where the test signal means comprises a test signal path for exchange of test signals.

14. The system of claim 8 wherein the test signal means comprises signal means coupled to the first functional signal path and coupled to the second functional signal path for exchanging test signals on the first and second functional signal paths out of band.

15. The system of claim 14 where the out of band test signals are modulated out of a band of modulation associated with the first and second functional signals.

16. The system of claim 14 where the out of band test signals are encoded out of a range of encoding values associated with encoding of the first and second functional signals.

17. A method for testing a cross-coupled signal pair coupled between a first and second circuit board, the method comprising the steps of:

applying a test request signal from the first circuit board to the second circuit board wherein the test request signal is out of band with respect to the cross-coupled signal pair;

latching within the second circuit board the present state of a functional signal of the cross-coupled signal pair in response to detection of the test request signal;

exchanging test signals between the first circuit board and the second circuit board to test the signal path for the functional signal; and using the latched present state of the functional signal within the second circuit board during the exchange of test signals.

18. The method of claim 17 wherein the step of exchanging comprises exchanging the test signals over a test signal path coupled between the first circuit board and the second circuit board.

19. The method of claim 17 wherein the step of exchanging comprises modulating the test signals out of a band of modulation associated with the functional signal exchanged over the cross-coupled signal pair.

20. The method of claim 17 wherein the step of exchanging comprises encoding the test signals out of a range of encoding values associated with encoding of the functional signal exchanged over the cross-coupled signal pair.

* * * * *